(12) United States Patent
Lee et al.

(10) Patent No.: US 12,713,908 B2
(45) Date of Patent: Aug. 18, 2026

(54) SEMICONDUCTOR DEVICE

(71) Applicant: Samsung Electronics Co., Ltd., Suwon-si (KR)

(72) Inventors: Anthony Dongick Lee, Suwon-si (KR); Min Chan Gwak, Suwon-si (KR); Guk Hee Kim, Suwon-si (KR); Young Woo Kim, Suwon-si (KR); Sang Cheol Na, Suwon-si (KR); Kyoung Woo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 419 days.

(21) Appl. No.: 18/397,389

(22) Filed: Dec. 27, 2023

(65) Prior Publication Data

US 2024/0304513 A1 Sep. 12, 2024

(30) Foreign Application Priority Data

Mar. 7, 2023 (KR) ........................ 10-2023-0030010

(51) Int. Cl.

| | |
|---|---|
| ***H10W 40/20*** | (2026.01) |
| ***H10D 30/43*** | (2025.01) |
| ***H10D 30/67*** | (2025.01) |
| ***H10D 62/10*** | (2025.01) |
| ***H10P 72/70*** | (2026.01) |
| ***H10W 20/41*** | (2026.01) |
| ***H10W 40/22*** | (2026.01) |
| ***H10W 40/25*** | (2026.01) |

(52) U.S. Cl.
CPC ............ *H10W 40/20* (2026.01); *H10D 30/43* (2025.01); *H10D 30/6729* (2025.01); *H10D 30/6735* (2025.01); *H10D 62/121* (2025.01); *H10P 72/74* (2026.01); *H10W 20/427* (2026.01); *H10W 40/226* (2026.01); *H10W 40/253* (2026.01); *H10P 72/7408* (2026.01)

(58) Field of Classification Search
None
See application file for complete search history.

(56) References Cited

U.S. PATENT DOCUMENTS 7,906,842 B2 3/2011 Park
9,741,696 B2 8/2017 Katkar et al.
(Continued)

*Primary Examiner* — Feifei Yeung Lopez
(74) *Attorney, Agent, or Firm* — Wolf, Greenfield & Sacks, P.C.

(57) ABSTRACT

A semiconductor device includes an active pattern on a first surface of a substrate and extending in a first direction, a field insulating film on the first surface and a side surface of the active pattern, a gate structure on the active pattern and field insulating film and extending in a second direction intersecting the first direction, a source/drain area on a side surface of the gate structure and contacting the active pattern, and a through-contact extending in a third direction perpendicular to the first and second directions and extending through the field insulating film. The device further includes a buried pattern in the substrate contacting the through-contact, a backside wiring structure on a second surface of the substrate and electrically connected to the buried pattern, and a heat-dissipating structure in the substrate adjacent to the buried pattern. The heat-dissipating structure fills a trench extending from the second surface into the substrate.

20 Claims, 15 Drawing Sheets

(56) References Cited

U.S. PATENT DOCUMENTS

| | | | | |
|---|---|---|---|---|
| 11,052,784 | B2 | 7/2021 | Mensch et al. | |
| 11,355,410 | B2 | 6/2022 | Huang et al. | |
| 2014/0014975 | A1 | 1/2014 | Bae et al. | |
| 2020/0266169 | A1 | 8/2020 | Kang et al. | |
| 2022/0077062 | A1 | 3/2022 | Van Dal et al. | |
| 2022/0130761 | A1 | 4/2022 | Kim et al. | |
| 2023/0317558 | A1* | 10/2023 | Sharma | H10W 40/47 257/714 |

* cited by examiner

SEMICONDUCTOR DEVICE

CROSS-REFERENCE TO RELATED APPLICATION

This application claims priority from Korean Patent Application No. 10-2023-0030010 filed on Mar. 7, 2023 in the Korean Intellectual Property Office, and all the benefits accruing therefrom under 35 U.S.C. 119, the contents of which in its entirety are herein incorporated by reference.

BACKGROUND

The present disclosure relates generally to a semiconductor device. More specifically, the present disclosure relates to a semiconductor device including a backside wiring pattern.

Due to characteristics such as miniaturization, multifunctionality, and/or low manufacturing cost of a semiconductor device, the semiconductor device is in the limelight as an important element in the electronics industry. Semiconductor devices may be classified into a semiconductor memory device that stores therein logic data, a semiconductor logic device that computes and processes the logic data, and a hybrid semiconductor device that includes a memory element and a logic element.

As a data processing speed of the semiconductor device increases, electrical current consumption of the semiconductor device may increase. When the current consumption of the semiconductor device increases, a heat amount dissipated therefrom may increase. Accordingly, there is an increasing need for a semiconductor device capable of effectively dissipating heat generated during a processing operation to an outside environment.

SUMMARY

A technical purpose to be achieved by the present disclosure is to provide a semiconductor device with improved heat dissipation ability.

Purposes according to the present disclosure are not limited to the above-mentioned purpose. Other purposes and advantages according to the present disclosure that are not mentioned may be understood based on the following descriptions, and may be more clearly understood based on embodiments according to the present disclosure. Further, it will be easily understood that the purposes and advantages according to the present disclosure may be realized using means shown in the claims and combinations thereof.

A semiconductor device according to some embodiments for achieving the technical purpose as described above includes a substrate including a first surface and a second surface opposite to each other; an active pattern disposed on the first surface and extending in a first direction; a field insulating film disposed on the first surface and covering at least a portion of a side surface of the active pattern; a gate structure disposed on the active pattern and the field insulating film and extending in a second direction intersecting the first direction; a source/drain area disposed on a side surface of the gate structure and contacting the active pattern; a through-contact extending in a third direction intersecting the first and second directions so as to extend through the field insulating film; a buried pattern disposed in the substrate and contacting the through-contact; a backside wiring structure disposed on the second surface and electrically connected to the buried pattern; and a heat-dissipating structure disposed in the substrate so as to be adjacent to one side of the buried pattern, wherein the heat-dissipating structure fills a trench extending from the second surface into the substrate.

A semiconductor device according to some embodiments for achieving the technical purpose as described above includes a substrate including a first surface and a second surface opposite to each other; an active pattern disposed on the first surface and extending in a first direction; a field insulating film disposed on the first surface and covering at least a portion of a side surface of the active pattern; a gate structure disposed on the active pattern and the field insulating film and extending in a second direction intersecting the first direction; a through-contact extending in a third direction intersecting the first and second directions so as to extend through the field insulating film; a buried pattern disposed in the substrate and contacting the through-contact; a backside wiring structure disposed on the second surface and electrically connected to the buried pattern; and a heat-dissipating structure disposed in the substrate and spaced apart from the buried pattern in the second direction, wherein the heat-dissipating structure is electrically insulated from the backside wiring structure.

A semiconductor device according to some embodiments for achieving the technical purpose as described above includes a substrate including a first surface and a second surface opposite to each other; an active pattern disposed on the first surface and extending in a first direction; a field insulating film disposed on the first surface and covering at least a portion of a side surface of the active pattern; a gate structure disposed on the active pattern and the field insulating film and extending in a second direction intersecting the first direction; a source/drain area disposed on a side surface of the gate structure and contacting the active pattern; a frontside wiring structure disposed on the first surface and electrically connected to the source/drain area or the gate structure; a through-contact extending in a third direction intersecting the first and second directions so as to extend through the field insulating film; a buried pattern disposed in the substrate and contacting the through-contact; a backside wiring structure disposed on the second surface and electrically connected to the buried pattern; and a heat-dissipating structure disposed in the substrate and spaced apart from the buried pattern in the second direction.

Details of other embodiments are included in the detailed descriptions and drawings.

BRIEF DESCRIPTION OF DRAWINGS

The above and other aspects and features of the present disclosure will become more apparent by describing in detail illustrative embodiments thereof with reference to the attached drawings, wherein like reference numerals (when used) indicate corresponding elements throughout the several views, and in which.

DETAILED DESCRIPTIONS

Figure 1:
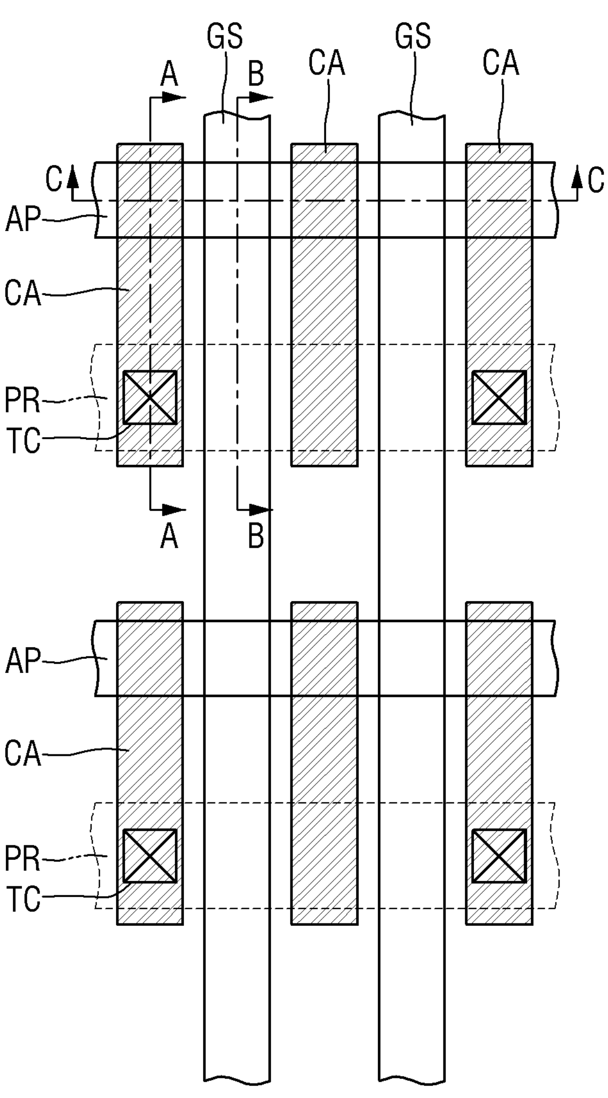
FIG. 1 is a layout diagram, in top plan view, for illustrating at least a portion of an example semiconductor device according to some embodiments.
Figure 1:
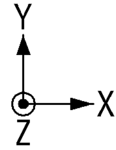

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a more thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included in the idea and scope of the present disclosure as defined by the appended claims.

A shape, a size, a ratio, an angle, a number, etc., disclosed in the drawings for illustrating embodiments of the present disclosure are illustrative, and the present disclosure is not limited thereto.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although ordinal terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the idea and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the apparatus in use or in operation, in addition to the orientation depicted in the figures. For example, when the apparatus in the drawings may be turned over, elements described as "below" or "beneath" or "under" other elements or features would then be oriented "above" the other elements or features. Thus, the example terms "below" and "under" may encompass both an orientation of above and below. The apparatus may be otherwise oriented, for example, rotated 90 degrees or at other orientations, and the spatially relative descriptors used herein should be interpreted accordingly.

In the present disclosure, only MBCFET® (a registered trademark of Samsung Electronics Co., Ltd.) including a multi-bridge channel is illustrated as an example of an electronic element included in a semiconductor device. However, this is only an example. In another example, the semiconductor device may include a tunneling transistor (tunneling FET), a VFET (Vertical FET), a CFET (Complementary FET), or a three-dimensional (3D) transistor. Alternatively, the semiconductor device may include a bipolar junction transistor, a lateral double-diffused transistor (LDMOS), or etc.

Hereinafter, semiconductor devices according to some embodiments are described with reference to FIGS. 1 to 9.

Figure 2:
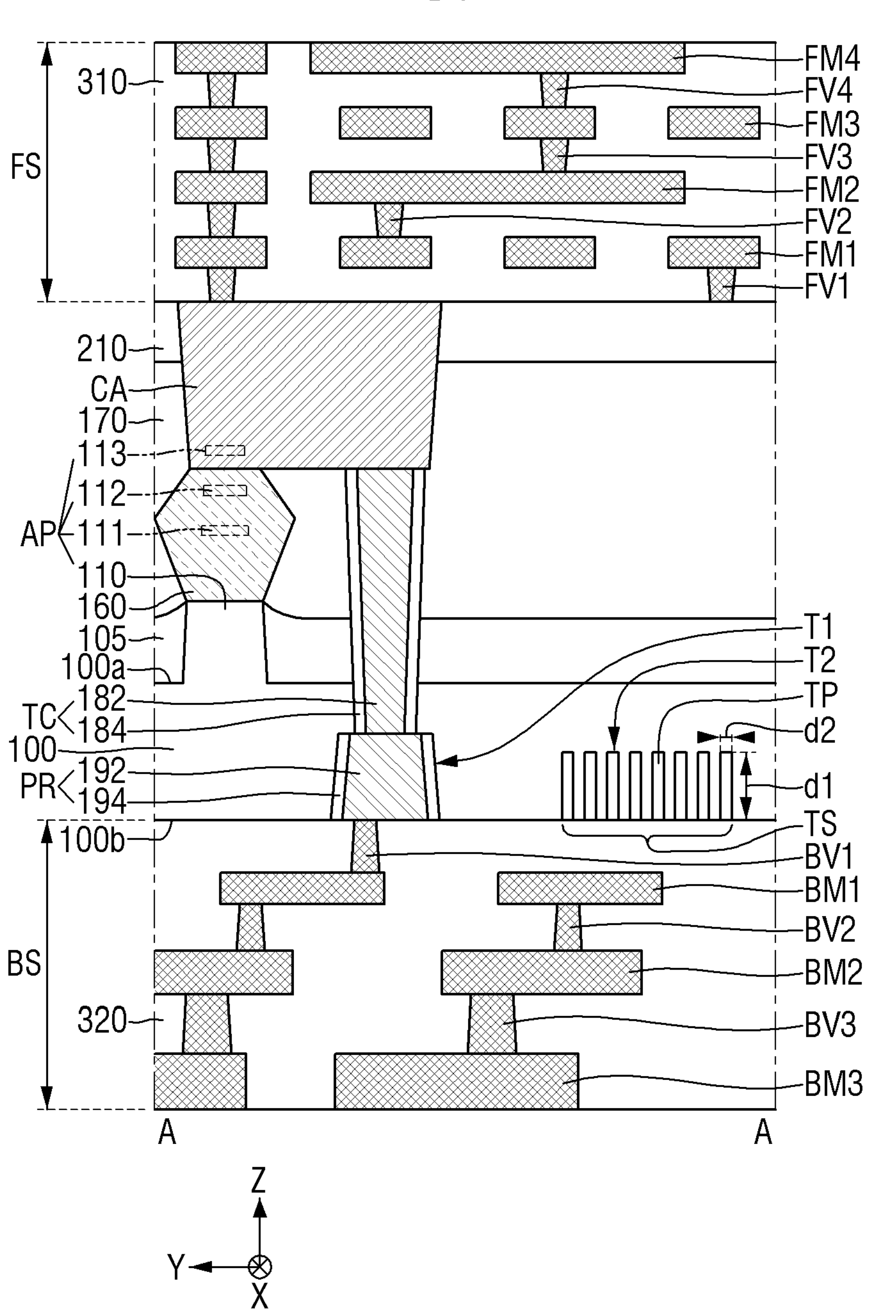
FIG. 2 is a schematic cross-sectional view taken along line A-A of FIG. 1.
Figure 3:
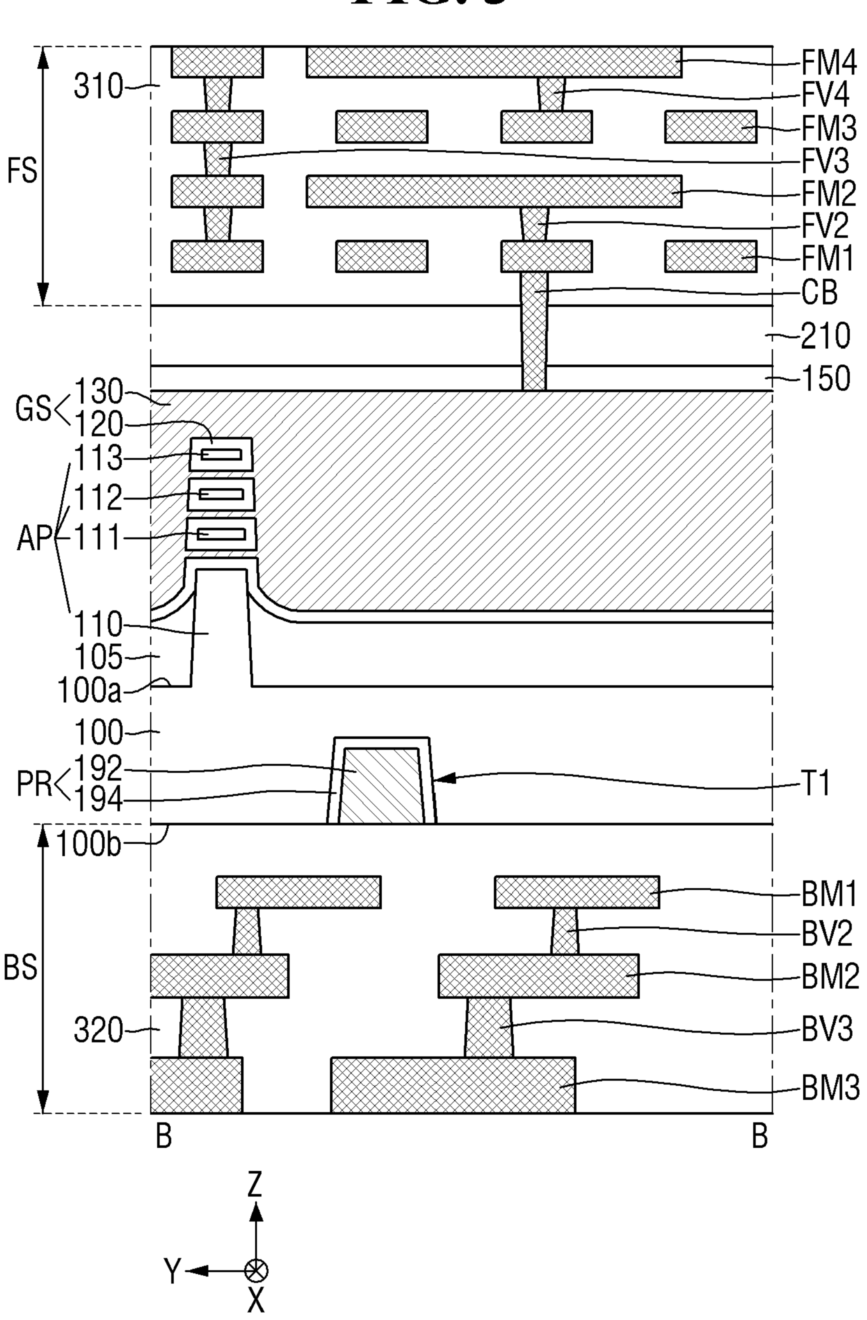
FIG. 3 is a schematic cross-sectional view taken along line B-B of FIG. 1.
Figure 4:
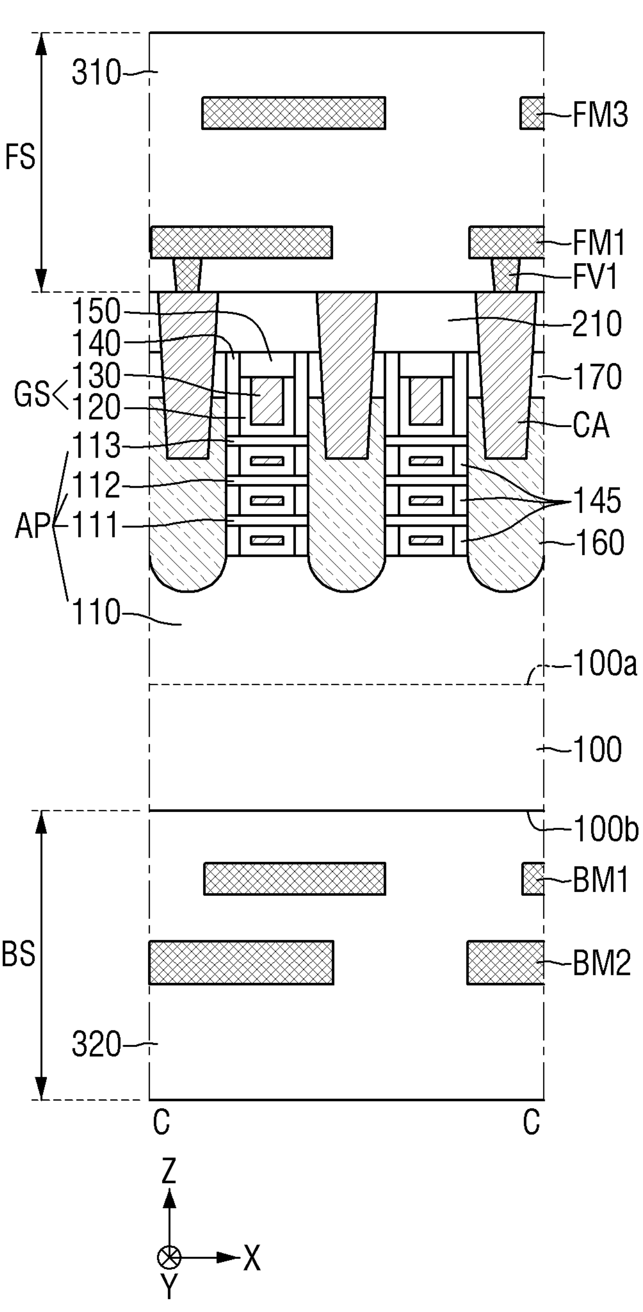
FIG. 4 is a schematic cross-sectional view taken along line C-C of FIG. 1.

FIG. 1 is a layout diagram, in top plan view, for illustrating at least a portion of an example semiconductor device according to some embodiments. FIG. 2 is a schematic cross-sectional view taken along line A-A of FIG. 1. FIG. 3 is a schematic cross-sectional view taken along line B-B of FIG. 1. FIG. 4 is a schematic cross-sectional view taken along line C-C of FIG. 1.

Referring to FIGS. 1 to 4, a semiconductor device according to some embodiments includes a first substrate 100, an active pattern AP, a field insulating film 105, a gate structure GS, a gate spacer 140, a gate capping pattern 150, a source/drain area 160, a first interlayer insulating film 170, a second interlayer insulating film 210, a frontside wiring structure FS, a through-contact TC, a buried pattern PR, a backside wiring structure BS, and a heat-dissipating structure TS.

The first substrate 100 may be a semiconductor substrate. For example, the first substrate 100 may be made of bulk silicon or may be a SOI (silicon-on-insulator) substrate. The first substrate 100 may be a silicon substrate, or may be made of a material other than silicon, including, for example, silicon germanium, SGOI (silicon germanium on insulator), indium antimonide, lead telluride compound, indium arsenide, indium phosphide, gallium arsenide or gallium antimonide. However, the present disclosure is not limited thereto. For convenience of description, hereinafter, an example in which the first substrate 100 is embodied as the silicon substrate is described.

The first substrate 100 may include a first surface 100*a* and a second surface 100*b* that are opposite to each other. The active pattern AP may be disposed on the first surface 100*a* of the first substrate 100. In the present disclosure, the first surface 100*a* of the first substrate 100 on which the active pattern AP is disposed may also be referred to as a front surface or a front side. Furthermore, the second surface 100*b* of the first substrate 100 opposite to the first surface 100*a* may also be referred to as a rear surface, a rear side, or a backside. The first surface 100*a* and the second surface 100*b* may extend parallel to a plane defined in a first direction X and a second direction Y which may intersect one another (i.e., in a horizontal direction).

The active pattern AP may be formed on the first surface 100*a* of the first substrate 100. The active pattern AP may extend in an elongate manner in a first direction X parallel to the first surface 100*a*. Furthermore, a plurality of active patterns AP may extend side by side or in parallel to each other and in the first direction X.

In some embodiments, the active patterns AP may include first to third bridge patterns 111 to 113 that are sequentially stacked on the first substrate 100, and spaced apart from each other (in a third direction Z, perpendicular to the first direction X and second direction Y) and extend in the first direction X. This active pattern AP may be used as a channel area of MBCFET® including a multi-bridge channel. The number of bridge patterns included in the active pattern AP is just an example, and is not limited to what is illustrated.

In some embodiments, the active pattern AP may further include a fin pattern 110. The fin pattern 110 may protrude from the first surface 100*a* of the first substrate 100 in the third direction Z and extend in the first direction X. The first to third bridge patterns 111 to 113 may be sequentially stacked on an upper surface of the fin pattern 110.

The field insulating film 105 may be formed on the first surface 100*a* of the first substrate 100. The field insulating film 105 may surround at least a portion of a side surface of the active pattern AP. The term "surround" (or "surrounding," "surrounds," or like terms) as may be used herein is intended to broadly refer to an element, structure or layer that envelops, extends around, encircles, or encloses another element, structure or layer on all sides, although breaks or gaps may also be present. Thus, for example, a material layer having voids therein may still "surround" another layer which it encircles.

In some embodiments, the field insulating film 105 may include a concave upper surface. For example, as shown in FIGS. 2 and 3, a height of the upper surface of the field insulating film 105 from the first surface 100*a* of the first substrate 100 may decrease and then be constant as the field insulating film 105 extends away from the fin pattern 110 (i.e., in the second direction Y). It is illustrated only that a top (i.e., upper surface) of the fin pattern 110 protrudes upwardly beyond the topmost surface of the field insulating film 105. However, this is only an example. In another example, the upper surface of the fin pattern 110 may be coplanar with the topmost surface of the field insulating film 105.

The field insulating film 105 may include, for example, at least one of silicon oxide ($SiO_2$), silicon oxynitride (SiON), silicon oxycarbonitride (SiOCN), or a combination thereof. However, the present disclosure is not limited thereto. For example, the field insulating film 105 may include a silicon oxide ($SiO_2$) film.

The gate structure GS may be formed on the active pattern AP and the field insulating film 105. The gate structure GS may intersect the active pattern AP. For example, the gate structure GS may extend in an elongate manner in the second direction Y intersecting the first direction X and parallel to the first surface 100*a*.

In some embodiments, at least a portion of the active pattern AP may extend in the first direction X and extend through the gate structure GS. For example, each of the first to third bridge patterns 111 to 113 may extend in the first direction X and extend through the gate structure GS. The gate structure GS may surround each of the first to third bridge patterns 111 to 113.

The gate structure GS may include a gate dielectric film 120 and a gate electrode 130. The gate dielectric film 120 and the gate electrode 130 may be sequentially stacked on the active pattern AP.

The gate dielectric film 120 may be deposited on the active pattern AP. For example, the gate dielectric film 120 may extend along upper and side surfaces of the active pattern AP and the upper surface of the field insulating film 105. Furthermore, the gate dielectric film 120 may surround (i.e., extend around) at least a portion of the active pattern AP. For example, the gate dielectric film 120 may extend around each of the first to third bridge patterns 111 to 113.

The gate dielectric film 120 may include, for example, at least one of silicon oxide, silicon oxynitride, silicon nitride, or a high-k material having a higher dielectric constant than that of silicon oxide. The high dielectric constant (high-k) material may include, for example, at least one of hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$) or combinations thereof. However, the present disclosure is not limited thereto.

The semiconductor device according to some embodiments may include an NC (negative capacitance) FET using a negative capacitor. For example, the gate dielectric film 120 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series with each other, and the capacitance of each of the capacitors has a positive value, a total capacitance is smaller than the capacitance of each individual capacitor. On the contrary, when at least one of the capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic percent) of aluminum. In this connection, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide. However, the present disclosure is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness (i.e., cross-sectional thickness) sized to exhibit ferroelectric properties. Although the thickness of the ferroelectric material film may be, for example, in a range of about 0.5 to about 10 nm, the present disclosure is not limited thereto. Because a critical thickness exhibiting the ferroelectric properties may be vary based on a type of the ferroelectric material, the thickness of the ferroelectric material film may vary depending on the type of the ferroelectric material.

In one example, the gate dielectric film 120 may include one ferroelectric material film. In another example, the gate dielectric film 120 may include a plurality of ferroelectric material films spaced apart from each other. The gate dielectric film 120 may have a multilayer structure in which a plurality of ferroelectric material films and a plurality of paraelectric material films are alternately stacked on top of each other.

The gate electrode 130 may be deposited on the gate dielectric film 120. That is, the gate dielectric film 120 may be interposed between the active pattern AP and the gate electrode 130. The gate dielectric film 120 may be interposed between the field insulating film 105 and the gate electrode 130. The gate electrode 130 may be formed by, for example, a replacement process. However, the present disclosure is not limited thereto.

Although the gate electrode 130 is illustrated as being embodied as a single film, this is only an example, and the gate electrode 130 may be formed by sequentially stacking a plurality of conductive layers. For example, the gate electrode 130 may include a work function control film for adjusting a work function and a filling conductive film filling a space defined by the work function control film. The work function control film may include, for example, at least one of TiN, TaN, TiC, TaC, TiAlC, or combinations thereof. The filling conductive film may include, for example, W or Al.

The gate spacer 140 may be formed on the first substrate 100 and the field insulating film 105. Furthermore, the gate spacer 140 may extend along a side surface of the gate electrode 130 in the third direction Z. In some embodiments, a portion of the gate dielectric film 120 may be interposed between the gate electrode 130 and the gate spacer 140. For example, the gate dielectric film 120 may further extend along an inner side surface of the gate spacer 140. The gate dielectric film 120 may be formed in a replacement process. However, the present disclosure is not limited thereto.

The gate spacer 140 may include, for example, at least one of silicon nitride, silicon oxynitride, silicon oxycarbide, silicon boron nitride, silicon carbonitride, silicon oxycarbonitride, or combinations thereof. However, the present disclosure is not limited thereto. For example, the gate spacer 140 may be embodied as a silicon nitride film.

The gate capping pattern 150 may be formed on the gate structure GS. The gate capping pattern 150 may extend along an upper surface of the gate structure GS. An upper surface of the gate capping pattern 150 is only shown as being coplanar with the upper surface of the gate spacer 140. However, this is only an example. In another example, the gate capping pattern 150 may cover (i.e., on or over) the upper surface of the gate spacer 140. The term “cover” (or “covering” or other like terms) as used herein is intended to refer to a material, layer or structure being on or over another material, layer or structure, but does not require the material, layer or structure to entirely cover the other material, layer or structure. Thus, for example, a material or layer having openings or holes therein may still be considered to cover another material or layer.

The gate capping pattern 150 may include an insulating material, for example, at least one of silicon nitride, silicon oxynitride, silicon oxycarbide, silicon boron nitride, silicon carbonitride, silicon oxycarbonitride, or combinations thereof. However, the present disclosure is not limited thereto. For example, the gate capping pattern 150 may include a silicon nitride film.

The source/drain area 160 may be formed on at least one side surface (for example, on both opposing side surfaces) of the gate structure GS. Furthermore, the source/drain area 160 may contact the active pattern AP. For example, an upper surface of the fin pattern 110 may contact the source/drain area 160. Furthermore, each of the first to third bridge patterns 111 to 113 may extend through the gate structure GS and the gate spacer 140 so as to contact the source/drain area 160. The source/drain area 160 may be electrically insulated from the gate electrode 130 via the gate dielectric film 120 and/or the gate spacer 140. The source/drain area 160 may act as a source or a drain of a field-effect transistor including the active pattern AP and the gate structure GS.

In some embodiments, the source/drain area 160 may include an epitaxial layer. For example, the source/drain area 160 may be embodied as an epitaxial pattern formed in an epitaxial growth process. As shown in FIG. 2, a shape of the source/drain area 160 in a cross-sectional view intersecting the first direction X may be a hexagon. However, this is only an example. Depending on an epitaxial growth condition, the shape of the source/drain area 160 in the cross-sectional view intersecting the first direction X may be one of various shapes, such as, for example, a square shape or a diamond shape.

When the field-effect transistor including the active pattern AP and the gate structure GS is an NFET, the source/drain area 160 may contain n-type impurities or impurities for preventing diffusion of the n-type impurities. For example, the source/drain area 160 may contain at least one of phosphorous (P), antimony (Sb), arsenic (As), or combinations thereof.

In some embodiments, the source/drain area 160 may include a tensile stress material. For example, when the active pattern AP is embodied as a silicon (Si) pattern, the source/drain area 160 may include a material (for example, silicon carbide (SiC)) having a smaller lattice constant than that of silicon (Si). The tensile stress material may apply tensile stress to the active pattern AP to improve carrier mobility in a channel area.

When the field effect transistor including the active pattern AP and the gate structure GS is a PFET, the source/drain area 160 may contain p-type impurities or impurities for preventing diffusion of the p-type impurities. For example, the source/drain area 160 may contain at least one of boron (B), carbon (C), indium (In), gallium (Ga), aluminum (Al), or combinations thereof.

In some embodiments, the source/drain area 160 may include a compressive stress material. For example, when the active pattern AP is embodied as a silicon (Si) pattern, the source/drain area 160 may include a material (for example, silicon germanium (SiGe)) having a higher lattice constant than that of silicon (Si). The compressive stress material may apply compressive stress to the active pattern AP to improve carrier mobility in a channel area.

In some embodiments, an inner spacer 145 may be further formed on a side surface of the gate electrode 130 (i.e., extending in the Z direction). The inner spacer 145 may be formed on a portion of the side surface of the gate electrode 130 disposed between adjacent ones of the first to third bridge patterns 111 to 113. Furthermore, the inner spacer 145 may be formed on a portion of the side surface of the gate electrode 130 disposed between the fin pattern 110 and the first bridge pattern 111. The gate electrode 130 may be electrically insulated from the source/drain area 160 via the gate dielectric film 120, the gate spacer 140, and/or the inner spacer 145. In some further embodiments, the inner spacer 145 may be omitted.

The inner spacer 145, when used, may include, for example, at least one of silicon nitride, silicon oxynitride, silicon oxycarbide, silicon boron nitride, silicon carbonitride, silicon oxycarbonitride, or combinations thereof. However, the present disclosure is not limited thereto. For example, the inner spacer 145 may include a silicon nitride film. The inner spacer 145 may include the same material as that of the gate spacer 140, or may include a material different from that of the gate spacer 140. A thickness (i.e., cross-sectional thickness) of the inner spacer 145 is illustrated to be equal to that of the gate spacer 140. However, this is only an example.

The first interlayer insulating film 170 may be formed to fill a space on an outer side surface of the gate spacer 140. For example, the first interlayer insulating film 170 may cover the field insulating film 105 and the source/drain area 160.

The second interlayer insulating film 210 may be formed on the first interlayer insulating film 170. For example, the second interlayer insulating film 210 may cover an upper surface of the first interlayer insulating film 170, an upper surface of the gate spacer 140, and the upper surface of the gate capping pattern 150.

Each of the interlayer insulating films 170 and 210 may include at least one of, for example, silicon oxide, silicon nitride, silicon oxynitride, silicon oxycarbide, silicon boron nitride, silicon carbonitride, silicon oxycarbonitride, or a low-k material having a dielectric constant smaller than that of silicon oxide. The low dielectric constant material may include, for example, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, a porous polymeric material, and combinations thereof. The present disclosure is not limited thereto.

The frontside wiring structure FS may be disposed on the first (i.e., upper or front) surface 100*a* of the first substrate 100. For example, the frontside wiring structure FS may be formed on an upper surface of the second interlayer insulating film 210. The frontside wiring structure FS may include a frontside inter-wiring insulating film 310, a plurality of frontside wiring patterns FM1 to FM4, and a plurality of frontside via patterns FV1 to FV4. The frontside wiring patterns FM1 to FM4 may be sequentially stacked on the second interlayer insulating film 210. The frontside via patterns FV1 to FV4 may be sequentially stacked on the second interlayer insulating film 210. The frontside via patterns FV1 to FV4 may interconnect the frontside wiring patterns FM1 to FM4 to each other. The frontside wiring patterns FM1 to FM4 and the frontside via patterns FV1 to FV4 may be formed in the frontside inter-wiring insulating film 310. The frontside wiring patterns FM1 to FM4 may be insulated from each other via the frontside inter-wiring insulating film 310. The frontside via patterns FV1 to FV4 may be insulated from each other via the frontside inter-wiring insulating film 310. The number of layers and the number of the frontside wiring patterns FM1 to FM4, and the frontside via patterns FV1 to FV4, and the arrangement thereof in the frontside inter-wiring insulating film 310 are merely examples. The present disclosure is not limited thereto.

In some embodiments, a width (in the X direction) of each of the frontside via patterns FV1 to FV4 may decrease as each of the frontside via patterns FV1 to FV4 extends toward the first surface 100*a* of the first substrate 100; that is, opposing sidewalls of each of at least a subset of the frontside via patterns FV1 to FV4 may slope inwardly from a top surface toward a bottom surface of the frontside via patterns FV1 to FV4. This may be due to characteristics of an etching process for forming the frontside via patterns FV1 to FV4.

The frontside wiring structure FS provides a signal line and/or a power line for various electronic elements (for example, a field effect transistor including the active pattern AP and the gate structure GS formed on the first surface 100*a* of the first substrate 100). For example, a source/drain contact CA may be formed on the source/drain area 160. The source/drain contact CA may extend through the interlayer insulating films 170 and 210 so as to contact the source/drain area 160. The first frontside via pattern FV1 of the frontside wiring structure FS may contact the source/drain contact CA. Thus, the frontside wiring structure FS may be electrically connected to the source/drain area 160.

In some embodiments, a gate contact CB (FIG. 3) may be formed on the gate structure GS. The gate contact CB may extend through the second interlayer insulating film 210, the first interlayer insulating film 170, and the gate capping pattern 150 so as to be connected to the gate electrode 130. The gate contact CB may connect the gate electrode 130 and the first frontside wiring pattern FM1 to each other. Thus, the frontside wiring structure FS may be electrically connected to the gate electrode 130. Unlike what is illustrated, in some further embodiments, the gate contact CB may connect the gate electrode 130 and the first frontside via pattern FV1 to each other.

Although not specifically shown, each of the frontside wiring patterns FM1 to FM4 and the frontside via patterns FV1 to FV4 may include a barrier conductive film and a filling conductive film. The barrier conductive film may include a metal or metal nitride to prevent diffusion of a material of the filling conductive film into the surrounding frontside inter-wiring insulating film 310. The barrier conductive film may include, for example, at least one of titanium (Ti), tantalum (Ta), tungsten (W), nickel (Ni), cobalt (Co), platinum (Pt), alloys thereof, or nitrides thereof. However, the present disclosure is not limited thereto. The filling conductive film may include, for example, at least one of aluminum (Al), copper (Cu), tungsten (W), molybdenum (Mo), cobalt (Co), ruthenium (Ru), or alloys thereof. However, the present disclosure is not limited thereto.

In some embodiments, a width of each of the source/drain contact CA and the gate contact CB may decrease as each of the source/drain contact CA and the gate contact CB extends toward the first surface 100*a* of the first substrate 100. This may be due to characteristics of an etching process for forming each of the source/drain contact CA and the gate contact CB.

The through-contact TC may extend in the third direction Z perpendicular to the first direction X and the second direction Y and thus may extend through the field insulating film 105. The through-contact TC may contact the first substrate 100. For example, a vertical level (i.e., height) of a lower surface of the through-contact TC, in the Z direction, may be lower than or equal to a vertical level of the first surface 100*a* of the first substrate 100.

The through-contact TC may be electrically connected to various electronic elements (for example, a field-effect transistor including the active pattern AP and the gate structure GS) formed on the first surface 100*a* of the first substrate 100. For example, the through-contact TC may contact the source/drain area 160.

In some embodiments, the through-contact TC may contact the source/drain contact CA. For example, the through-contact TC may contact a lower surface of the source/drain contact CA. Thus, the through-contact TC may be electrically connected to the source/drain area 160.

In some embodiments, the through-contact TC may include a through-conductive film 182 and a through-spacer 184. The through-conductive film 182 may include, for example, at least one of aluminum (Al), copper (Cu), tungsten (W), molybdenum (Mo), cobalt (Co), ruthenium (Ru), or alloys thereof. However, the present disclosure is not limited thereto. The through-spacer 184 may surround (i.e., extend around) a side surface of the through-conductive film 182. The through-spacer 184 may include an insulating material for electrically insulating the through-conductive film 182 from the first substrate 100. For example, the through-spacer 184 may include at least one of silicon oxide, silicon nitride, silicon oxynitride, silicon oxycarbonitride, or a combination thereof. However, the present disclosure is not limited thereto.

In some embodiments, a width of the through-contact TC (in the Y direction) may gradually decrease as the through-contact TC extends in a direction (for example, in the Z-direction) from the frontside wiring structure FS to the backside wiring structure BS. This may be due to a fact that an etching process for forming the through-contact TC is performed on the first surface 100a of the first substrate 100.

A shape of the through-contact TC is not limited to what is shown and may have various shapes such as a circle, a rectangle, or another polygon in a plan view (for example, in an X-Y plane). Alternatively, unlike what is shown, the through-contact TC may have a shape extending in one direction (for example, the first direction X) as a polygon in a plan view (for example, in an X-Y plane).

The buried pattern PR may be formed in the first substrate 100. The buried pattern PR may contact the through-contact TC. For example, an upper surface of the buried pattern PR may contact a bottom of the through-contact TC extending through the first surface 100a of the first substrate 100. Thus, the buried pattern PR may be electrically connected to various electronic elements (for example, a field effect transistor including the active pattern AP and the gate structure GS) formed on the first surface 100a of the first substrate 100. For example, the buried pattern PR may be electrically connected to the source/drain area 160.

In some embodiments, the buried pattern PR may include a buried conductive film 192 and a buried spacer 194. The buried conductive film 192 may include, for example, at least one of aluminum (Al), copper (Cu), tungsten (W), molybdenum (Mo), cobalt (Co), ruthenium (Ru), or alloys thereof. However, the present disclosure is not limited thereto. The buried spacer 194 may surround (i.e., extend around) a side surface of the buried conductive film 192. The buried spacer 194 may include an insulating material for electrically insulating the buried conductive film 192 from the first substrate 100. For example, the buried spacer 194 may include at least one of silicon oxide, silicon nitride, silicon oxynitride, silicon oxycarbonitride, or a combination thereof. However, the present disclosure is not limited thereto.

In some embodiments, a width of the buried pattern PR (in the Y direction) may gradually decrease as the buried pattern PR extends in a direction (for example, in the Z direction) from the second surface 100b of the first substrate 100 toward the first surface 100a of the first substrate 100. This may be due to a fact that an etching process for forming the buried pattern PR is performed on the second surface 100b of the first substrate 100.

In order to form the buried pattern PR, a first trench T1 extending from the second surface 100b of the first substrate 100 into the first substrate 100 may be formed in the third direction Z. The buried spacer 194 and the buried conductive film 192 may be formed in the first trench T1, with the conductive film 192 filling the trench T1. The term “fill” (or “filling,” “filled,” or like terms) as may be used herein is intended to refer broadly to either completely filling a defined space (e.g., first trench T1) or partially filling the defined space; that is, the defined space need not be entirely filled but may, for example, be partially filled or have voids or other spaces throughout.

The backside wiring structure BS may be disposed on the second surface 100b of the first substrate 100. The backside wiring structure BS may include a backside inter-wiring insulating film 320, a plurality of backside wiring patterns BM1 to BM3, and a plurality of backside via patterns BV1 to BV3. The backside wiring patterns BM1 to BM3 may be sequentially stacked on the second surface 100b of the first substrate 100. The backside via patterns BV1 to BV3 may be sequentially stacked on the second surface 100b of the first substrate 100. The backside via patterns BV1 to BV3 may interconnect the backside wiring patterns BM1 to BM3 to each other. The backside wiring patterns BM1 to BM3 and the backside via patterns BV1 to BV3 may be formed in the backside inter-wiring insulating film 320. The backside wiring patterns BM1 to BM3 may be insulated from each other via the backside inter-wiring insulating film 320. The backside via patterns BV1 to BV3 may be insulated from each other via the backside inter-wiring insulating film 320. The number of layers and the number of the backside wiring patterns BM1 to BM3, and the backside via patterns BV1 to BV3 and the arrangement thereof in the backside inter-wiring insulating film 320 are merely examples. The present disclosure is not limited thereto.

In some embodiments, a width of each of the backside via patterns BV1 to BV3 (in the Y direction) may decrease as each of the backside via patterns BV1 to BV3 extends toward the second surface 100b of the first substrate 100. This may be due to characteristics of an etching process for forming each of the backside via patterns BV1 to BV3.

In some embodiments, the backside wiring structure BS may provide a power delivery network (PDN) for various electronic elements (for example, a field-effect transistor including the active pattern AP and the gate structure GS) formed on the first surface 100a of the first substrate 100. For example, the backside wiring structure BS may be electrically connected to the buried pattern PR. A power voltage (for example, a source voltage VSS or a drain voltage VDD supplied from an external source may be transferred to a topmost backside wiring pattern (for example, the third backside wiring pattern BM3) of the backside wiring structure BS, and may be provided to the source/drain area 160 via the buried pattern PR, the through-contact TC, and the source/drain contact CA.

In some embodiments, the buried pattern PR may extend in the first direction X in a plan view. This buried pattern PR may act as a power rail for various electronic elements (for example, a field-effect transistor including the active pattern AP and the gate structure GS) formed on the first surface 100a of the first substrate 100.

Although not specifically shown, each of the backside wiring patterns BM1 to BM3 and the backside via patterns BV1 to BV3 may include a barrier conductive film and a filling conductive film. The barrier conductive film may include a metal or metal nitride to prevent diffusion of a material of the filling conductive film. The barrier conductive film may include, for example, at least one of titanium (Ti), tantalum (Ta), tungsten (W), nickel (Ni), cobalt (Co), platinum (Pt), alloys thereof, or nitrides thereof. However, the present disclosure is not limited thereto. The filling conductive film may include, for example, at least one of aluminum (Al), copper (Cu), tungsten (W), molybdenum (Mo), cobalt (Co), ruthenium (Ru), or alloys thereof. However, the present disclosure is not limited thereto.

The heat-dissipating structure TS may be disposed in the substrate 100. The heat-dissipating structure TS may be formed in an area that does not overlap with the source/drain area 160 and/or the gate structure GS in the Z direction. The term “overlap” (or “overlapping,” or like terms), as used herein, is intended to broadly refer to a first element that intersects with at least a portion of a second element in the vertical direction (i.e., Z direction), but does not require that the first and second elements be completely aligned with one another in a horizontal plane (i.e., in the X and Y directions).

The substrate 100 may have a plurality of second trenches T2 defined therein extending vertically (i.e., in the Z direction) from the second surface 100*b* of the substrate 100 into a portion of the substrate 100. The heat-dissipating structure TS may include a plurality of heat-dissipating patterns TP respectively filling the second trenches T2. A spacing between adjacent ones of the plurality of heat-dissipating patterns TP (i.e., pitch) may be a spacing between adjacent ones of the plurality of second trenches T2.

The heat-dissipating patterns TP may be spaced apart from the buried pattern PR in the second direction Y (i.e., laterally). The heat-dissipating patterns TP may be disposed on one side of the buried pattern PR while being adjacent to the buried pattern PR in the second direction Y.

In order to form the heat-dissipating patterns TP, the plurality of second trenches T2 extending from the second surface 100*b* of the first substrate into the first substrate 100 in the third direction Z may be formed. The plurality of heat-dissipating patterns TP may be formed so as to respectively fill the plurality of second trenches T2.

Although not specifically shown, the heat-dissipating patterns TP may be formed by patterning a mask formed on the second surface 100*b*. For example, the mask pattern may be formed in an area other than an area where the heat-dissipating patterns TP are to be formed, and then, the second trenches T2 may be formed in the first substrate 100 using the mask pattern.

The heat-dissipating patterns TP may be formed by filling the second trenches T2 with the insulating material. In this case, the heat-dissipating patterns TP may not be electrically connected to the backside wiring structure BS. For example, the insulating material may include silicon. However, the present disclosure is not limited thereto.

Each of the heat-dissipating patterns TP spaced apart from each other may have a fin shape. In this case, a length d1 in the third direction Z of each of the heat-dissipating patterns TP may be greater than a length d2 in the second direction Y thereof. In this case, a contact area between each of the heat-dissipating patterns TP and the first substrate 100 increases, such that heat generated in the semiconductor device may be effectively dissipated through the heat-dissipating structure TS.

Although eight heat-dissipating patterns TP are shown in the drawing by way of example, the number of the heat-dissipating patterns TP and the spacing between the adjacent heat-dissipating patterns TP are not limited to what are shown in the drawing. Furthermore, a depth of the second trenches T2 (in the Z direction) and the spacing between the adjacent second trenches T2 (in the Y direction) are also not limited to what are shown in the drawing.

Figure 5:
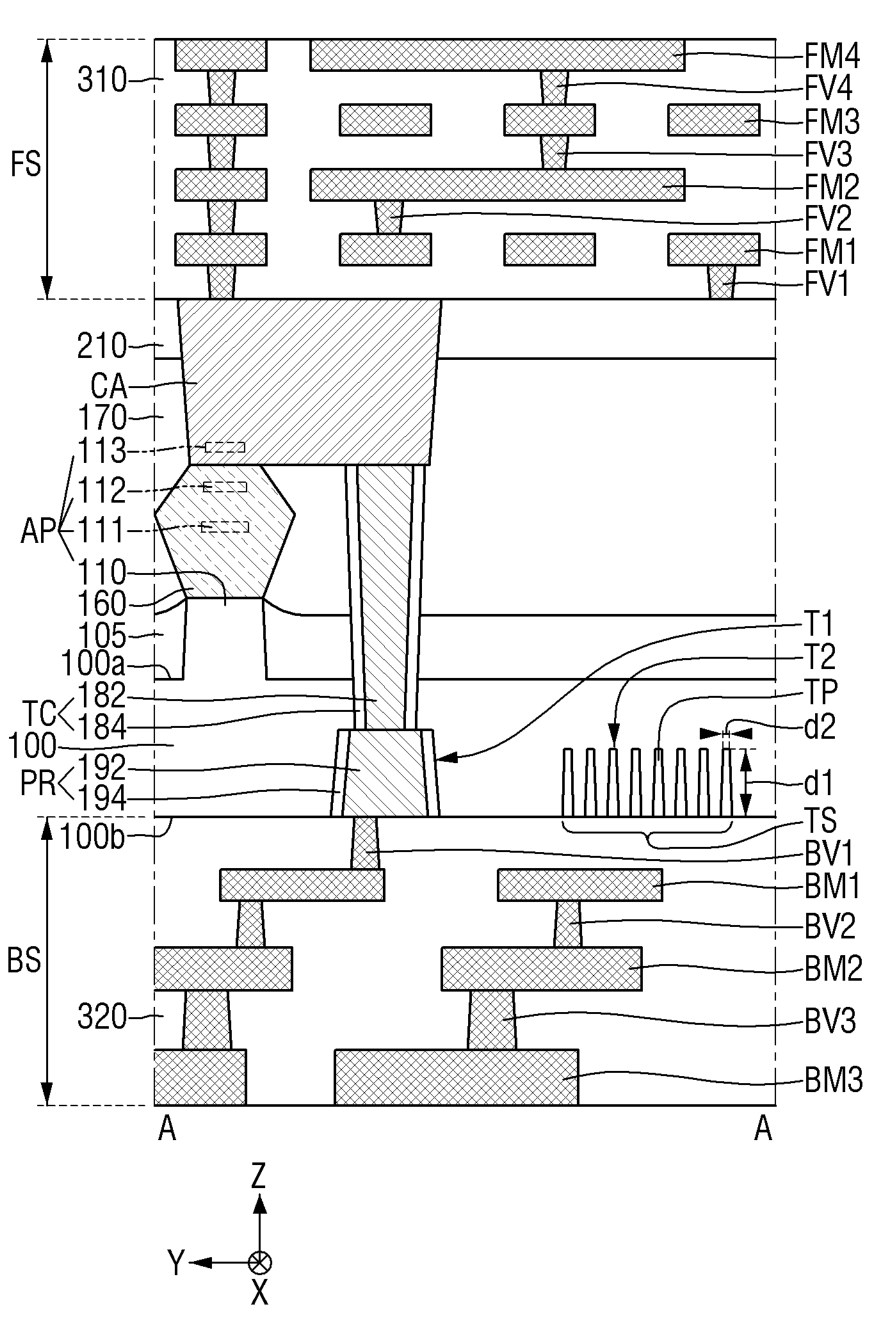
FIGS. 5 to 7 are various schematic cross-sectional views for illustrating at least a portion of an example semiconductor device according to some embodiments.
Figure 6:
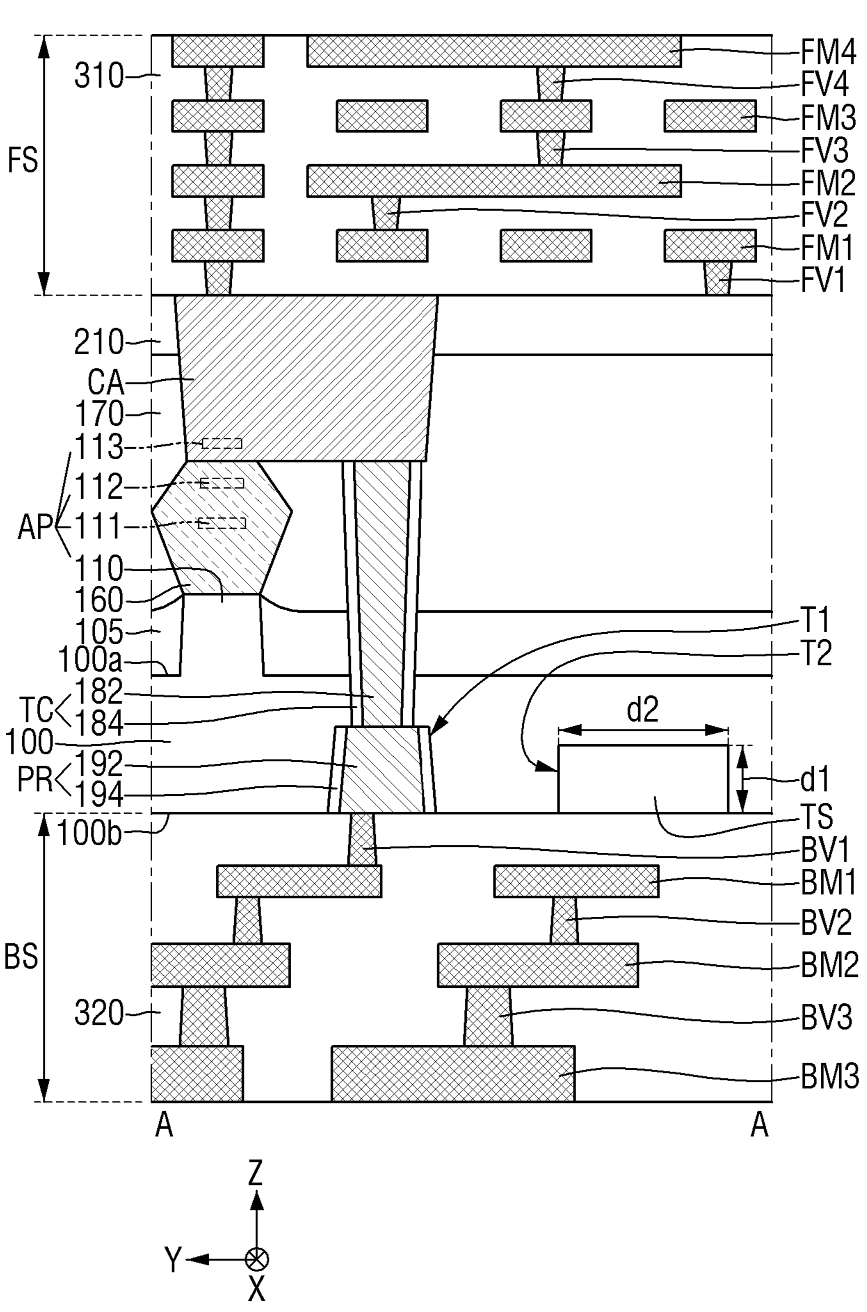
Figure 7:
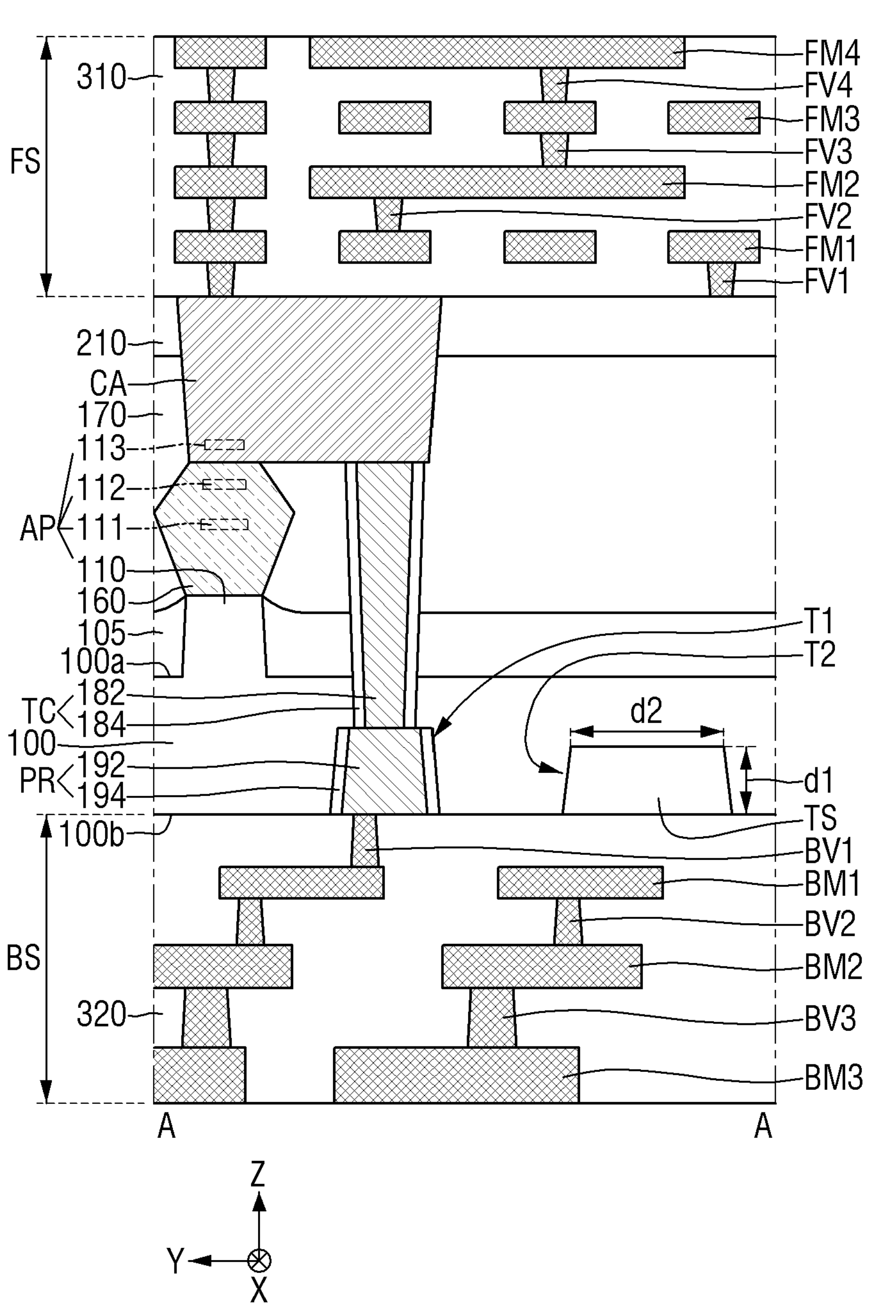

FIGS. 5 to 7 are various schematic cross-sectional views for illustrating a semiconductor device according to some embodiments. For the convenience of description, the descriptions duplicate with those set forth above with reference to FIGS. 1 to 4 are briefly set forth or omitted. For reference, FIGS. 5 to 7 are schematic cross-sectional views taken along line A-A of FIG. 1, respectively.

Referring to FIG. 5, in a semiconductor device according to some embodiments, each of the heat-dissipating patterns TP may have a trapezoidal shape. In this case, the length d1 in the third direction Z of the heat-dissipating pattern TP may be greater than the length d2 in the second direction Y thereof. Furthermore, the length d2 in the second direction Y of each of the heat-dissipating patterns TP may increase as each of the heat-dissipating patterns TP extends through the first substrate 100 toward the backside wiring structure BS. This may be due to characteristics of an etching process for forming the second trenches T2.

Referring to FIG. 6, in a semiconductor device according to some embodiments, the heat-dissipating structure TS may have a rectangular shape. In this case, the length d2 in the second direction Y of the heat-dissipating structure TS may be greater than the length d1 in the third direction Z thereof. In this embodiments, the heat-dissipating structure TS may be formed as a single trench.

Referring to FIG. 7, in a semiconductor device according to some embodiments, the heat-dissipating structure TS may have a trapezoidal shape. In this case, the length d2 in the second direction Y of the heat-dissipating structure TS may be greater than the length d1 in the third direction Z thereof. Furthermore, the length d2 in the second direction Y of the heat-dissipating structure TS may increase as the heat-dissipating structure TS extends through the first substrate 100 toward the backside wiring structure BS.

Figure 8:
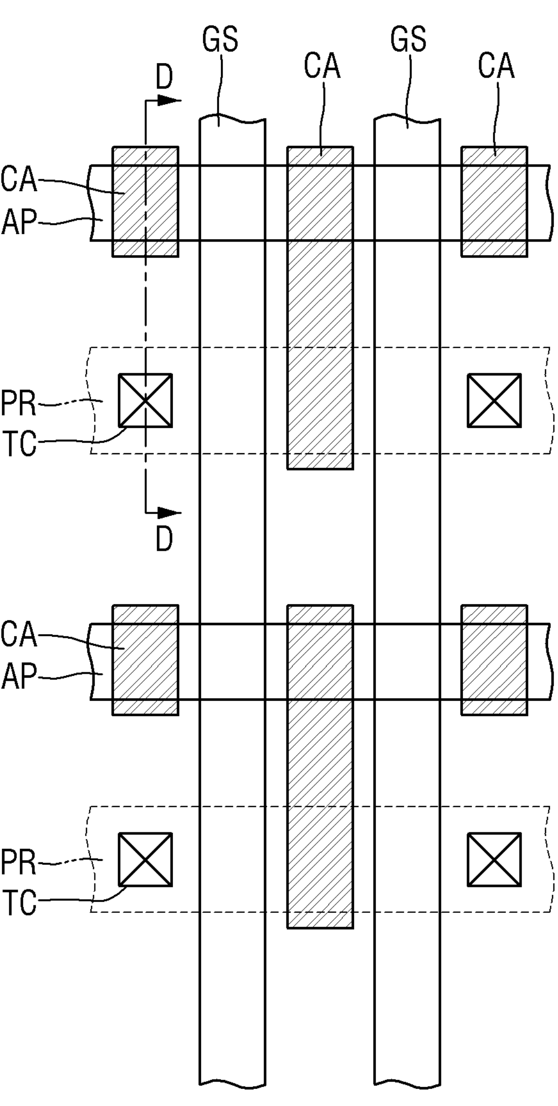
FIG. 8 is a layout diagram, in top plan view, for illustrating at least a portion of an example semiconductor device according to some embodiments.
Figure 8:
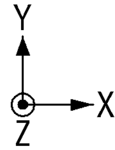
Figure 9:
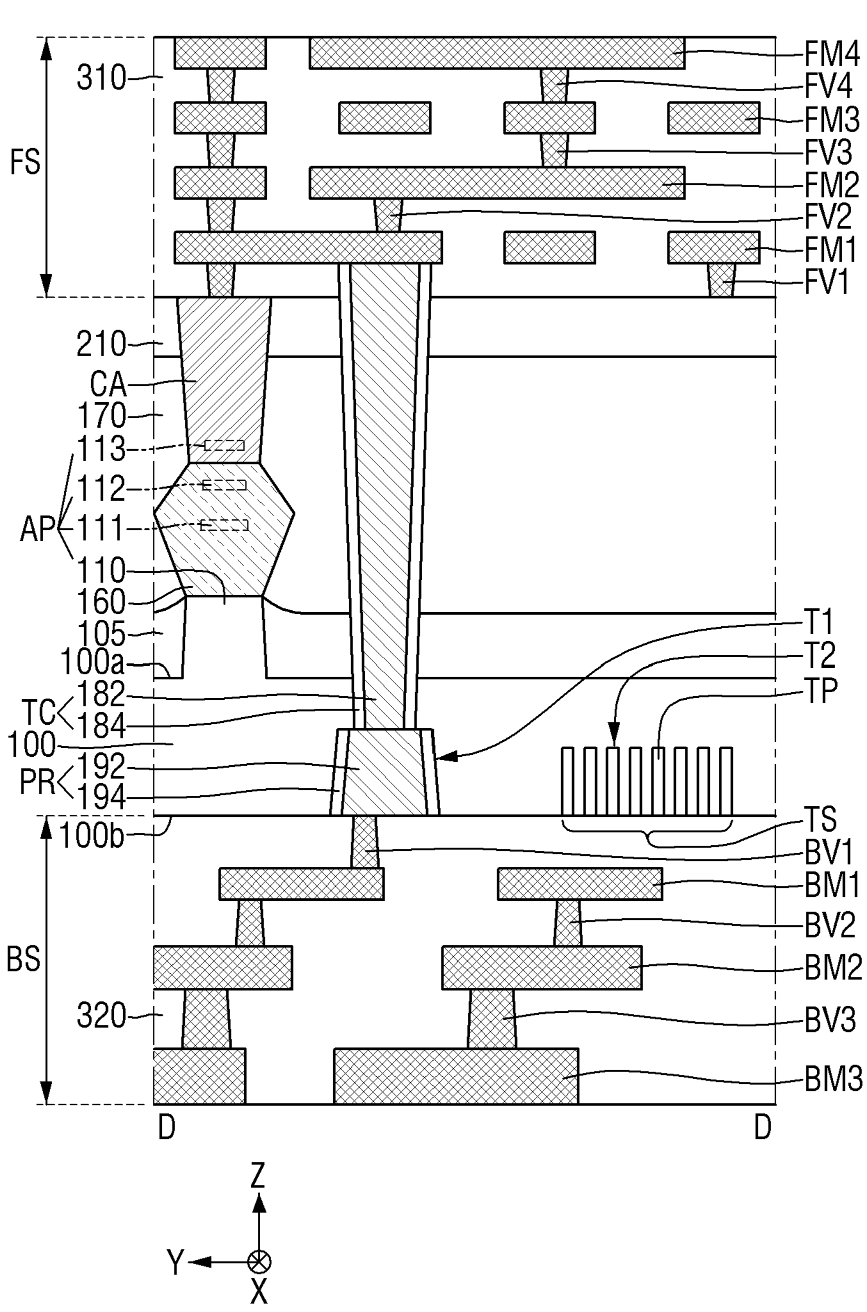
FIG. 9 is a schematic cross-sectional view taken along line D-D of FIG. 8.

FIG. 8 is a layout diagram, in a top plan view, for illustrating a semiconductor device according to some embodiments. FIG. 9 is a schematic cross-sectional view taken along line D-D of FIG. 8. For convenience of description, the descriptions duplicate with those set forth above with reference to FIGS. 1 to 7 are briefly set forth or omitted.

Referring to FIGS. 8 and 9, in a semiconductor device according to some embodiments, the through-contact TC may contact the frontside wiring structure FS.

For example, the through-contact TC may contact the lower surface of the first frontside wiring pattern FM1. Furthermore, the first frontside wiring pattern FM1 contacting the through-contact TC may be connected to the source/drain contact CA via the first frontside via pattern FV1. Thus, the through-contact TC may be electrically connected to the source/drain area 160.

Hereinafter, with reference to FIGS. 10 to 15, an example method for manufacturing a semiconductor device according to some embodiments is described.

FIGS. 10 to 15 are diagrams of intermediate structures corresponding to intermediate process steps for illustrating an example method for manufacturing a semiconductor device according to some embodiments. For convenience of description, the descriptions duplicate with those set forth above with reference to FIGS. 1 to 9 are briefly set forth or omitted.

Figure 10:
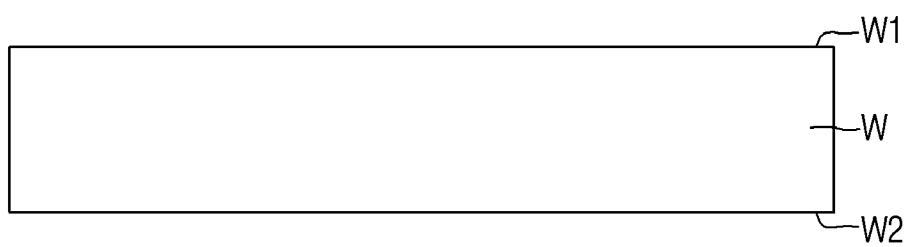
FIGS. 10 to 15 are diagrams of intermediate structures corresponding to intermediate process steps for illustrating an example method for manufacturing a semiconductor device according to some embodiments.

Referring to FIG. 10, a semiconductor substrate W including first and second surfaces W1 and W2, respectively, facing each other (i.e., opposing surfaces) may be provided. For example, the semiconductor substrate W may be a silicon substrate. In some embodiments, the semiconductor substrate W may refer to the first substrate 100. The second surface W2 of the semiconductor substrate W may refer to the second (lower) surface 100*b* of the first substrate 100 and the surface W1 may refer to the first (upper) surface 100*a* of the first substrate (see FIG. 2).

The frontside wiring structure FS may be disposed on the first surface W1 of the semiconductor substrate W so as to be adjacent to each other.

Figure 11:
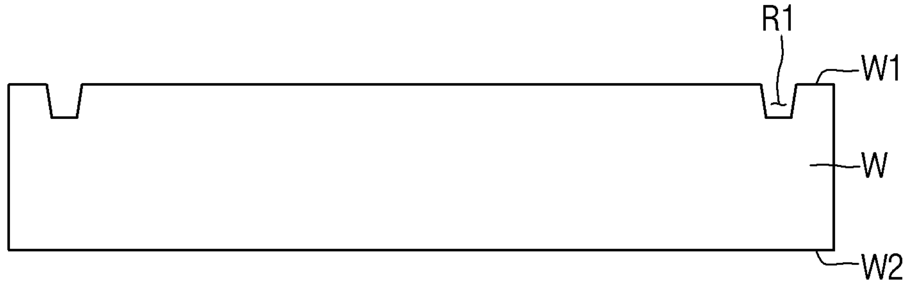

Referring to FIG. 11, a first recess R1 may be formed by trimming a portion of an edge area of the semiconductor substrate W. The first recess R1 may extend vertically from the first surface W1 of the semiconductor substrate W into the semiconductor substrate W.

Figure 12:
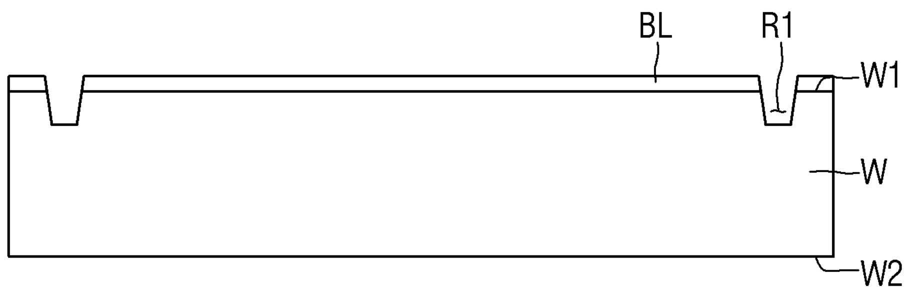

Referring to FIG. 12, a bonding layer BL may be formed on the first surface W1 of the semiconductor substrate W.

Figure 13:
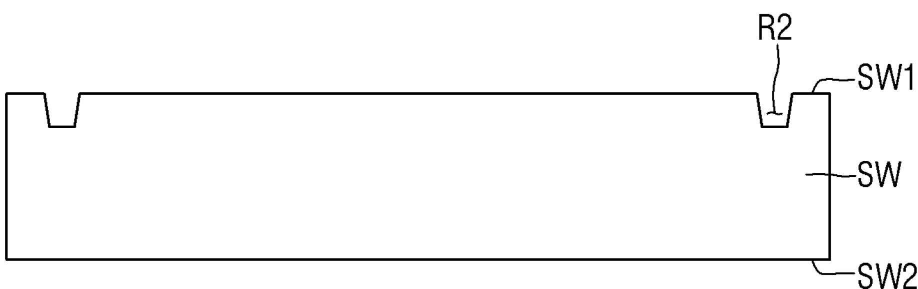

Referring to FIG. 13, a second recess R2 may be formed, and a support substrate SW including first and second surfaces SW1 and SW2 facing each other may be provided. The second recess R2 may extend vertically from the first surface SW1 of the support substrate SW into the support substrate SW. When the semiconductor substrate W (FIG. 12) and the support substrate SW are bonded to each other as will be described later, the second recess R2 may be used as a bonding key for alignment between the semiconductor substrate W and the support substrate SW.

Figure 14:
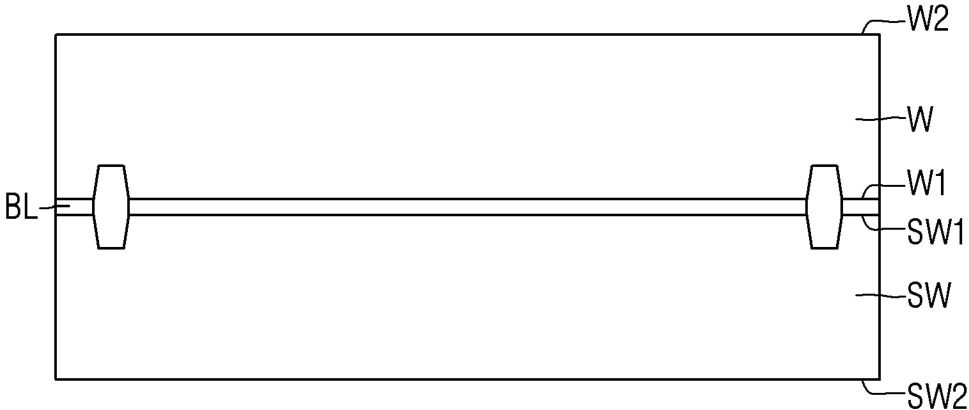

Referring to FIG. 14, the semiconductor substrate W may be flipped and placed on the support substrate SW so that the first surface W1 of the semiconductor substrate W and the first surface SW1 of the support substrate SW face each other. The semiconductor substrate W and the support substrate SW may be bonded to each other via the bonding layer BL; that is, the first surface W1 of the semiconductor substrate W and the first surface SW1 of the support substrate SW may be bonded to each other via the bonding layer BL.

Thus, the frontside wiring structure FS may be attached onto the support substrate SW.

Figure 15:
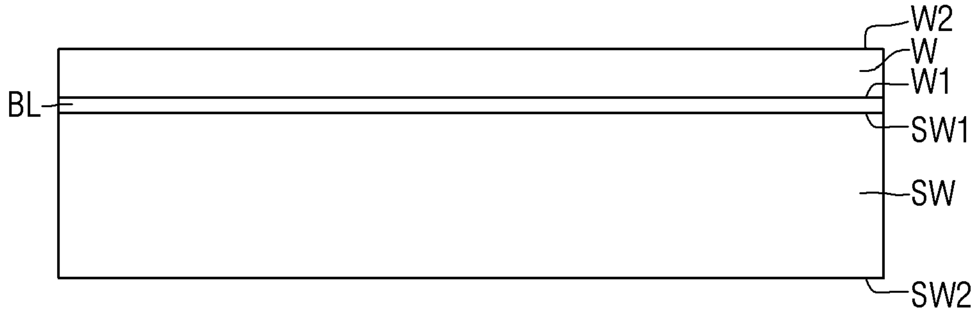

Referring to FIG. 15, a thickness of the semiconductor substrate W may be reduced by removing a portion of the semiconductor substrate W (e.g., by a chemical-mechanical polishing/planarization (CMP) process). Furthermore, an area where the bonding key has been formed may be removed by removing the edge area of each of the semiconductor substrate W and the support substrate SW.

Thereafter, a first trench for forming the buried pattern PR and a second trench for forming the heat-dissipating structure TS may be formed in the second surface W2 of the semiconductor substrate W (see, e.g., FIG. 2). A conductive material may fill the first trench to form the buried pattern PR. An insulating material may fill the second trench to form the heat-dissipating structure TS.

With reference, for example, to FIG. 2, the buried pattern PR may contact the through-contact TC. For example, an etching process may be performed on the second surface 100*b* of the first substrate 100 to form a trench exposing the through-contact TC. Subsequently, the buried pattern PR filling the trench may be formed. Thus, the buried pattern PR may be electrically connected to various electronic elements (for example, a field effect transistor including the active pattern AP and the gate structure GS) formed on the first surface 100*a* of the first substrate 100.

The heat-dissipating structure TS may be formed around the buried pattern PR. For example, an etching process may be performed on the second surface 100*b* of the first substrate 100 to form a trench exposing a portion of the first substrate 100. Subsequently, the heat-dissipating structure TS filling the trench may be formed. The heat-dissipating structure TS may include an insulating material. Thus, the heat-dissipating structure TS may effectively dissipate the heat generated in the semiconductor device while being electrically insulated from the above-described electronic elements (for example, the field effect transistor including the active pattern AP and the gate structure GS).

In some embodiments, the trench for forming the heat-dissipating structure TS and the trench for forming the buried pattern PR may be formed in the same process. Accordingly, the semiconductor device with improved heat dissipation ability may be provided without increasing the number of processes.

Subsequently, referring to FIG. 2, the backside wiring structure BS may be formed on the second surface 100*b* of the first substrate 100. For example, the backside inter-wiring insulating film 320, the plurality of backside wiring patterns BM1 to BM3, and the plurality of backside via patterns BV1 to BV3 may be formed on the second surface 100*b* of the first substrate 100. After the backside wiring structure BS has been formed, the support substrate SW may be removed from the semiconductor substrate W. In this way, the semiconductor device as described above using FIGS. 1 to 9 may be manufactured.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Spatially descriptive terms such as, but not limited to, "above," "over," "below," "under," "upper" and "lower" may be used herein to indicate a position of elements, structures or features relative to one another as illustrated in the figures, rather than absolute positioning. Thus, the semiconductor device may be otherwise oriented (e.g., rotated 90 degrees or at other orientations), and the spatially relative descriptions used herein may be interpreted accordingly.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. Likewise, it should be appreciated that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Although the embodiments of the present disclosure have been described above with reference to the accompanying drawings, the present disclosure may not be limited to the embodiments and may be implemented in various different forms. Those of ordinary skill in the technical field to which the present disclosure belongs will be able to understand that the present disclosure may be implemented in other specific forms without changing the technical idea or essential features of the present disclosure. Therefore, it should be understood that the embodiments as described above are not restrictive but illustrative in all respects.

What is claimed is:

1. A semiconductor device, comprising:

a substrate including a first surface and a second surface opposite to each other;

an active pattern on the first surface and extending in a first direction;

a field insulating film on the first surface of the substrate and on at least a portion of a side surface of the active pattern;

a gate structure on the active pattern and the field insulating film and extending in a second direction intersecting the first direction;

a source/drain area on a side surface of the gate structure and contacting the active pattern;

a through-contact extending in a third direction perpendicular to the first and second directions so as to extend through the field insulating film;

a buried pattern in the substrate and contacting the through-contact;

a backside wiring structure on the second surface of the substrate and electrically connected to the buried pattern; and a heat-dissipating structure in the substrate so as to be adjacent to one side of the buried pattern in the second direction, wherein the heat-dissipating structure fills a trench extending from the second surface into the substrate in the third direction.

2. The semiconductor device of claim 1, wherein the heat-dissipating structure includes a plurality of heat-dissipating patterns spaced from each other in the second direction, wherein each of the heat-dissipating patterns has a fin shape extending in the third direction.

3. The semiconductor device of claim 2, wherein a length in the third direction of each of the heat-dissipating patterns is greater than a length in the second direction of each of the heat-dissipating patterns.

4. The semiconductor device of claim 1, wherein a length in the second direction of the heat-dissipating structure is greater than a length in the third direction thereof.

5. The semiconductor device of claim 1, wherein a length in the second direction of the heat-dissipating structure increases as the heat-dissipating structure extends through the substrate in the third direction toward the backside wiring structure.

6. The semiconductor device of claim 1, wherein the heat-dissipating structure is electrically insulated from the backside wiring structure.

7. The semiconductor device of claim 1, wherein the heat-dissipating structure is non-overlapping with respect to the source/drain area in the third direction.

8. The semiconductor device of claim 1, wherein the heat-dissipating structure is non-overlapping with respect to the gate structure in the third direction.

9. The semiconductor device of claim 1, wherein the heat-dissipating structure includes an insulating material.

10. The semiconductor device of claim 1, further comprising a frontside wiring structure on the first surface and electrically connected to the source/drain area or the gate structure.

11. A semiconductor device, comprising:

a substrate including a first surface and a second surface opposite to each other;

an active pattern on the first surface and extending in a first direction;

a field insulating film on the first surface and on at least a portion of a side surface of the active pattern;

a gate structure on the active pattern and the field insulating film and extending in a second direction intersecting the first direction;

a through-contact extending in a third direction perpendicular to the first and second directions so as to extend through the field insulating film;

a buried pattern in the substrate and contacting the through-contact;

a backside wiring structure on the second surface and electrically connected to the buried pattern; and a heat-dissipating structure in the substrate and spaced apart from the buried pattern in the second direction, wherein the heat-dissipating structure is electrically insulated from the backside wiring structure.

12. The semiconductor device of claim 11, wherein the substrate comprises a plurality of trenches defined therein extending in the third direction from the second surface into a portion of the substrate, wherein the heat-dissipating structure includes a plurality of heat-dissipating patterns respectively filling the trenches.

13. The semiconductor device of claim 11, wherein a width of the through-contact in the second direction decreases as the through-contact extends in the third direction toward the buried pattern, wherein a width of the buried pattern in the second direction decreases as the buried pattern extends in the third direction toward the through-contact.

14. The semiconductor device of claim 11, further comprising a source/drain area on a side surface of the gate structure and contacting the active pattern, wherein the through-contact is electrically connected to the source/drain area.

15. The semiconductor device of claim 11, wherein the heat-dissipating structure includes an insulating material.

16. A semiconductor device, comprising:

a substrate including a first surface and a second surface opposite to each other;

an active pattern on the first surface and extending in a first direction;

a field insulating film on the first surface and on at least a portion of a side surface of the active pattern;

a gate structure on the active pattern and the field insulating film and extending in a second direction intersecting the first direction;

a source/drain area on a side surface of the gate structure and contacting the active pattern;

a frontside wiring structure on the first surface and electrically connected to the source/drain area or the gate structure;

a through-contact extending in a third direction perpendicular to the first and second directions so as to extend through the field insulating film;

a buried pattern in the substrate and contacting the through-contact;

a backside wiring structure on the second surface and electrically connected to the buried pattern; and a heat-dissipating structure in the substrate and spaced apart from the buried pattern in the second direction.

17. The semiconductor device of claim 16, wherein the active pattern includes a plurality of bridge patterns sequentially stacked on the substrate in the third direction and spaced apart from each other in the second direction, wherein each of the bridge patterns extends in the first direction so as to extend through the gate structure.

18. The semiconductor device of claim 16, wherein the backside wiring structure is configured to apply a power voltage to the source/drain area via the buried pattern and the through-contact.

19. The semiconductor device of claim 16, further comprising a source/drain contact on the source/drain area, wherein the source/drain contact connects the source/drain area and the frontside wiring structure to each other.

20. The semiconductor device of claim 16, wherein the through-contact connects the frontside wiring structure and the buried pattern to each other.

* * * * *